(12) United States Patent
Okada et al.

(10) Patent No.: US 7,087,295 B2
(45) Date of Patent: Aug. 8, 2006

(54) SURFACE-COATED CUTTING TOOL

(75) Inventors: Yoshio Okada, Itami (JP); Hideki Moriguchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 11 days.

(21) Appl. No.: 10/501,527

(22) PCT Filed: Jan. 14, 2003

(86) PCT No.: PCT/JP03/00232

§ 371 (c)(1),
(2), (4) Date: Jul. 16, 2004

(87) PCT Pub. No.: WO03/061885

PCT Pub. Date: Jul. 31, 2003

(65) Prior Publication Data

US 2005/0042482 A1 Feb. 24, 2005

(30) Foreign Application Priority Data

Jan. 18, 2002 (JP) .............................. 2002-010098
Nov. 29, 2002 (JP) .............................. 2002-347391

(51) Int. Cl.
*B23B 27/14* (2006.01)
(52) U.S. Cl. ......................... 428/216; 51/307; 51/309; 428/212; 428/336; 428/469; 428/472; 428/698; 428/699; 428/701; 428/702; 428/704
(58) Field of Classification Search ................ 428/212, 428/216, 336, 698, 699, 704, 701, 702, 469, 428/472; 51/307, 309
See application file for complete search history.

(56) References Cited

U.S. PATENT DOCUMENTS

| | | | | |
|---|---|---|---|---|
| 4,239,536 A | * | 12/1980 | Yamamoto et al. | ......... 428/565 |
| 4,895,770 A | * | 1/1990 | Schintlmeister et al. | .... 428/698 |
| 5,318,840 A | * | 6/1994 | Ikeda et al. | ................. 428/699 |
| 6,187,421 B1 | * | 2/2001 | Moriguchi et al. | ......... 428/216 |

FOREIGN PATENT DOCUMENTS

| | | |
|---|---|---|
| JP | 57-32366 A | 2/1982 |
| JP | 57-42152 | 9/1982 |
| JP | 58-67858 A | 4/1983 |
| JP | 59-44385 | 10/1984 |

(Continued)

*Primary Examiner*—Archene Turner
(74) *Attorney, Agent, or Firm*—McDermott Will & Emery LLP

(57) ABSTRACT

A coated cutting tool can suppress film spalling due to adhesion. The tool has on its substrate an inner layer, intermediate layer, and outer layer. The inner layer is composed of at least one material selected from the group consisting of the carbide, nitride, carbonitride, boride, boronitride, borocarbonitride, oxide, oxycarbide, oxynitride, and oxycarbonitride of the elements belonging to the IVa, Va, and VIa groups. The inner layer includes at least one layer having a columnar-crystal structure. The outer layer is composed of at least one oxide selected from the group consisting of aluminum oxide, zirconium oxide, hafnium oxide, and their solid solutions. The intermediate layer is composed of titanium boronitride, $TiB_xN_y$ (x, y: atomic %), that satisfies $0.001<x/(x+y)<0.04$. The intermediate layer has an average thickness of 0.1 to 1 μm and a surface roughness of 50 to 500 nm expressed by the vertical distance between the peak and valley lines within a reference length of 1 μm.

15 Claims, 2 Drawing Sheets

FOREIGN PATENT DOCUMENTS

| | | |
|---|---|---|
| JP | 60-37189 | 8/1985 |
| JP | 1-12835 | 3/1989 |
| JP | 5-8103 A | 1/1993 |
| JP | 10-176288 A | 6/1998 |
| JP | 11-140647 A | 5/1999 |
| JP | 2000-141107 A | 5/2000 |

* cited by examiner

SURFACE-COATED CUTTING TOOL

TECHNICAL FIELD

The present invention relates to a coated cutting tool suitable for cutting a material such as steel products.

BACKGROUND ART

Various types of coated cutting tools have been proposed. For example, the below-listed patent documents 1 to 6 have disclosed tools that have a coating on their substrate. An example of the structure of the coating is composed of an inner layer made of a Ti-based material, an outer layer made of $Al_2O_3$, and an outermost layer made of a Ti-based material. However, the bonding strength between the inner and outer layers is insufficient in most cases. To solve this problem, various bonding layers have been proposed.
(Patent document 1): published Japanese patent application Tokukoushou 57-42152
(Patent document 2): published Japanese patent application Tokukoushou 58-67858
(Patent document 3): published Japanese patent application Tokukoushou 59-44385
(Patent document 4): published Japanese patent application Tokukoushou 60-37189
(Patent document 5): published Japanese patent application Tokukouhei 1-12835
(Patent document 6): published Japanese patent application Tokukaihei 5-8103

On the other hand, the cutting load applied to the coating has extremely increased in recent years because the complicated shape of workpieces increases the number of working contacts and difficult-to-machine materials increase the amount of adhesion to the tool. More specifically, the increase in the amount of adhesion increases cutting resistance. As a result, film spalling or film wearing occurs abruptly, decreasing the tool life.

DISCLOSURE OF THE INVENTION

The principal object of the present invention is to offer a coated cutting tool capable of suppressing film spalling due to adhesion.

According to the present invention, the coated cutting tool has a coating on its substrate. The coating comprises an inner layer, an intermediate layer, and an outer layer, each comprising at least one layer. The inner layer is composed of at least one material selected from the group consisting of the carbide, nitride, carbonitride, boride, boronitride, borocarbonitride, oxide, oxycarbide, oxynitride, and oxycarbonitride of the elements belonging to the IVa, Va, and VIa groups in the periodic table. The inner layer includes at least one layer that has a columnar-crystal structure. The outer layer is composed of at least one oxide selected from the group consisting of aluminum oxide, zirconium oxide, hafnium oxide, and their solid solutions. The intermediate layer is composed of titanium boronitride, $TiB_xN_y$ (x, y: atomic %), that satisfies formula 1.

$$0.001 < x/(x+y) < 0.04 \quad \text{formula 1.}$$

The intermediate layer has an average thickness of 0.1 to 1 μm.

As shown in FIG. 1, the coated cutting tool of the present invention comprises a substrate 1, an inner layer 2, an intermediate layer 3, and an outer layer 4 in this order from inside. An identification layer 5 may be formed on the outer layer 4. As described above, the present invention specifies the boron content in the intermediate layer and limits the average thickness of the intermediate layer. This structure can produce high bonding strength between the inner and outer layers and reduce reactivity with iron. As a result, the present invention can produce a coated cutting tool that reduces the possibility of adhesion and film spalling. The structure of the coated cutting tool of the present invention is explained in detail below.

(Inner Layer)

The inner layer 2 is composed of at least one material selected from the group consisting of the carbide, nitride, carbonitride, boride, boronitride, borocarbonitride, oxide, oxycarbide, oxynitride, and oxycarbonitride of the elements belonging to the IVa, Va, and VIa groups in the periodic table. More specifically, the material may be TiC, TiN, TiCN, TiCNO, $TiB_2$, TiBN, TiCBN, ZrC, $ZrO_2$, HfC, and HfN, for example.

It is desirable that the inner layer include at least one layer having a columnar-crystal structure. The layer having a columnar-crystal structure has superior wear resistance. It is desirable that the layer having a columnar-crystal structure be composed of titanium carbonitride or titanium oxycarbonitride. The inner layer having a columnar-crystal structure can be produced mainly by adjusting the composition of the reaction gas and the temperature of the reaction and by prolonging the film formation period to a certain extent. It is desirable that the columnar-crystal structure have an aspect ratio of at least 5. This lower limit is determined by considering mainly the wear resistance after the outer layer wears away or is spalled.

The aspect ratio is determined by the ratio of the length of the crystal grain (vertical length=film thickness) to $(d1+d2)/2$, where d1 is the horizontal diameter of the grain at the top of the TiCN layer having a columnar-crystal structure, and d2 is the horizontal diameter of the grain at the bottom of the same TiCN layer.

The aspect ratio is measured by the following method. The surface of a vertically cut coated cutting tool is polished in a direction parallel to the cut surface or at a proper angle against the cut surface, desirably at most 10 degrees. The polished surface is treated with a proper corrosive liquid to clearly observe the grain boundaries. A micrograph of the treated surface is taken by using a scanning electron microscope at a proper magnification. The micrograph is used to calculate the aspect ratio of the crystal grain after clarifying the growing direction of the grain.

It is desirable that the inner layer have an average thickness of 1.0 to 20.0 μm. If the thickness is less than 1.0 μm, it is difficult to form the columnar crystal, so that the maintenance of the wear resistance becomes difficult after the outer layer is spalled. On the other hand, if the thickness is more than 20.0 μm, the inner layer becomes brittle, so that the wear resistance decreases.

(Outer Layer)

The outer layer 4 is composed of at least one oxide selected from the group consisting of aluminum oxide, zirconium oxide, hafnium oxide, and their solid solutions. These oxides are chemically stable, have low reactivity with iron, and have a low possibility of forming adhesion. Of these, $Al_2O_3$ is desirable. In particular, it is desirable that the outer layer consist mainly of α-type $Al_2O_3$. The α-type $Al_2O_3$ is stable at high temperatures and has superior mechanical strength and heat resistance. The expression "the outer layer consists mainly of α-type $Al_2O_3$" is used to mean that the outer layer contains at least 50% α-type $Al_2O_3$ by weight. It is desirable that the outer layer have an average thickness of 0.5 to 10.0 µm. If the thickness is less than 0.5 µm, the adhesion cannot be effectively suppressed. If the thickness is more than 10.0 µm, the outer layer tends to suffer chipping and spalling.

(Intermediate Layer)

The intermediate layer 3 sandwiched between the inner layer 2 and the outer layer 4 is composed of titanium boronitride, $TiB_xN_y$ (x, y: atomic %), that satisfies formula 1. Chlorine existing as an impurity in the intermediate layer is not included in formula 1.

$$0.001 < x/(x+y) < 0.04 \quad \text{formula 1.}$$

It is more desirable that the intermediate layer be composed of titanium boronitride, $TiB_xN_y$ (x, y: atomic %), that satisfies formula 2.

$$0.003 < x/(x+y) < 0.02 \quad \text{formula 2.}$$

When the amount of boron lies in the range shown by formula 1, the spalling of the outer layer can be suppressed. Furthermore, even when the TiBN layer is exposed due to the wear or spalling of the outer layer, the reactivity with the workpiece can be decreased, thereby increasing the tool life.

There is an idea of using $TiB_2$ as an intermediate layer to increase the bonding strength between the inner and outer layers. However, as can be seen from the graph in FIG. 2, $TiB_2$ has a reactivity with iron as high as about 35 times that of TiN. Therefore, the workpiece readily adheres. There is another idea of using TiN in place of TiBN as the intermediate layer. However, TiN not only produces a low bonding strength between the inner and outer layers but also has a notably low hardness. Therefore, the tool life cannot be increased. The present invention limits the amount of boron in the intermediate layer to reduce the reactivity with iron when the intermediate layer is exposed due to the wear or spalling of the outer layer. In other words, this limitation can suppress the adhesion of the workpiece. However, this reduction in the amount of boron causes a reduction in the hardness (the hardness of TiN is lower than $TiB_2$). Consequently, the wear resistance decreases when the TiBN layer is exposed. The present invention compensates for this decrease by the TiBN layer having a sufficient thickness and the inner layer having a columnar-crystal structure so that the wear resistance can be improved.

In addition, the adoption of the TiBN layer can suppress the increase in the grain size in the oxide layer constituting the outer layer. As a result, the surface unevenness of the coating can be decreased, thereby decreasing the cutting resistance. The above suppression occurs in the following process. First, the addition of a small amount of boron into TiN causes the resultant TiBN layer to have a structure constituted by fine grains. This fine-grain structure causes the outer layer to produce nuclei for crystal growth with a uniform size. As a result, the outer layer can have fine crystals. More specifically, the present invention specifies that the intermediate layer have a surface roughness of 50 to 500 nm within a reference length of 1 µm when the roughness is expressed by the vertical distance between the peak line and the valley line, where the peak line is the horizontal line drawn from the highest point and the valley line is the horizontal line drawn from the lowest point. This specification enables the uniform growth of the outer layer and minimizes the surface unevenness of the outermost layer of the coated cutting tool. Furthermore, the bonding strength between the intermediate and outer layers can be increased.

In addition, the wear resistance can be improved by limiting the thickness of the TiBN layer and by forming the inner layer with at least one Ti-based layer having a columnar-crystal structure. It is desirable that the intermediate layer have an average thickness of 0.1 to 1 µm. If the thickness is less than 0.1 µm, the bonding strength between the inner and outer layers cannot be effectively increased. If the thickness is more than 1 µm, the wear resistance of the coating cannot be effectively increased.

Furthermore, the bonding strength between the inner and outer layers can be further increased by employing the following structure:

(a) The intermediate layer 3 contains titanium boronitride, $TiB_xN_y$ (x, y: atomic %), that satisfies formula 1.

$$0.001 < x/(x+y) < 0.04 \quad \text{formula 1.}$$

(b) The intermediate layer 3 further contains at least one element contained in the inner layer, the outer layer, or both, except Ti, B, and N.

(c) When the intermediate layer 3 further contains at least one element contained in the inner layer, the amount of the at least one element contained in the inner layer decreases continuously or stepwise from the inner-layer side toward the thicknesswise center of the intermediate layer.

(d) When the intermediate layer 3 further contains at least one element contained in the outer layer, the amount of the at least one element contained in the outer layer decreases continuously or stepwise from the outer-layer side toward the thicknesswise center of the intermediate layer.

In this case, however, in order to attain sufficient bonding strength, the intermediate layer must have a surface roughness of 50 to 500 nm within a reference length of 1 µm when the roughness is expressed by the vertical distance between the peak and valley lines.

It is also desirable that the intermediate layer be composed of titanium oxyboronitride, $TiB_xN_yO_z$ (x, y, z: atomic %), in place of the titanium boronitride, $TiB_xN_y$ (x, y: atomic %), and that the titanium oxyboronitride satisfy formulae 1 and 3.

$$0.001 < x/(x+y) < 0.04 \quad \text{formula 1.}$$

$$0.0005 < x/(x+y+z) < 0.04 \text{ and } 0 < z/(x+y+z) < 0.5 \quad \text{formula 3.}$$

The oxygen-containing intermediate layer can have a finer grain size and a higher hardness than the titanium boronitride, which contains no oxygen. In addition, the limitation of the amount of boron further increases the bonding strength of the outer layer. As a result, the wear resistance is improved, and consequently the tool life can be increased.

If the value of x/(x+y+z) is not more than 0.0005, the decrease in the amount of boron causes a reduction in hardness. Conversely, if the value of x/(x+y+z) is not less than 0.04, the reactivity with the workpiece increases. As a result, when the intermediate layer is exposed, the reaction with the workpiece causes adhering objects to strongly adhere to the cutting portion of the tool, promoting spalling of the inner layer. It is also desirable that the value of x/(x+y+z) be less than 0.02. On the other hand, if the value of z/(x+y+z) is zero, the property is no different from that of the titanium boronitride, $TiB_xN_y$ (x, y: atomic %), which contains no oxygen. If the value is not less than 0.5, although the layer increases its hardness, it decreases its toughness, decreasing the fracture resistance at the time of intermittent cutting.

In addition, it is desirable that the intermediate layer be composed of titanium boronitride, $TiB_xN_y$ (x, y: atomic %), which contains no oxygen, placed at the inner-layer side and titanium oxyboronitride, $TiB_xN_yO_z$ (x, y, z: atomic %), which contains oxygen, placed at the outer-layer side. This structure can increase the bonding strength of both the inner layer and the outer layer, further increasing the tool life. In particular, it is desirable to provide an intermediate layer having a composition-graded structure in which the oxygen content increases from the inner-layer side toward the outer layer continuously or stepwise.

(Identification Layer)

It is desirable that the coated cutting tool have on the outer layer an identification layer 5 composed of at least one material selected from the group consisting of the carbide, nitride, carbonitride, oxide, oxycarbide, oxynitride, and oxycarbonitride of the elements belonging to the IVa, Va, and VIa groups in the periodic table. Generally, $Al_2O_3$ is black or brown. Consequently, if the entire outermost layer of the coating is composed of $Al_2O_3$, it is difficult to identify the used corner of the tool. Therefore, an identification layer is provided to facilitate the identification of the used corner. This layer also serves to increase the wear resistance. The identification layer may be either a single layer or a multiple layer. It is desirable that the identification layer have an average thickness of 0.2 to 5.0 μm or so.

(Surface Roughness of the Coating)

It is desirable that the outermost layer of the coating have an average surface roughness, Rmax, of 0.2 to 1.3 μm within a reference length of 5 μm at the portion for making contact with the workpiece except the vicinity of the cutting edge when measured by a method that observes the cross section of the tool.

Furthermore, it is desirable that the outermost layer of the coating have a surface roughness, Rmax, of at most 0.2 μm within a reference length of 5 μm in the vicinity of the cutting edge when measured by a method that observes the cross section of the tool. If the surface roughness exceeds the specified limit, the adhesion tends to occur, preventing the smooth flow of the chips. The vicinity of the cutting edge is a portion that actually performs the cutting operation and that is subjected to the cutting resistance most strongly. Therefore, the smoothing of the surface reduces the cutting resistance and enables the high-precision machining.

(Substrate)

The substrate 1 is made of cemented carbide composed of a hard phase and a binder phase. The hard phase consists mainly of tungsten carbide and contains at least one material selected from the group consisting of the carbide, nitride, carbonitride, and their solid solutions of the metals belonging to the IV a, Va, and VIa groups in the periodic table, excluding tungsten carbide. The expression "the hard phase consists mainly of tungsten carbide" is used to mean that the hard phase contains at least 50% tungsten carbide by weight. The binder phase contains at least one element selected from the iron-group metals.

(Applications)

The applications of the coated cutting tool of the present invention include end mills, indexable inserts for cutting, indexable inserts for milling machines, and indexable inserts for the work-rotating cutting method.

(Workpiece)

The types of workpiece materials to which the coated cutting tool of the present invention is particularly effective include low-carbon steel, medium-carbon steel, high-carbon steel, and other common steels as well as metals that tend to promote adhesion, such as ductile cast iron, stainless steel, and inconel.

BEST MODE FOR CARRYING OUT THE INVENTION

Figure 1:
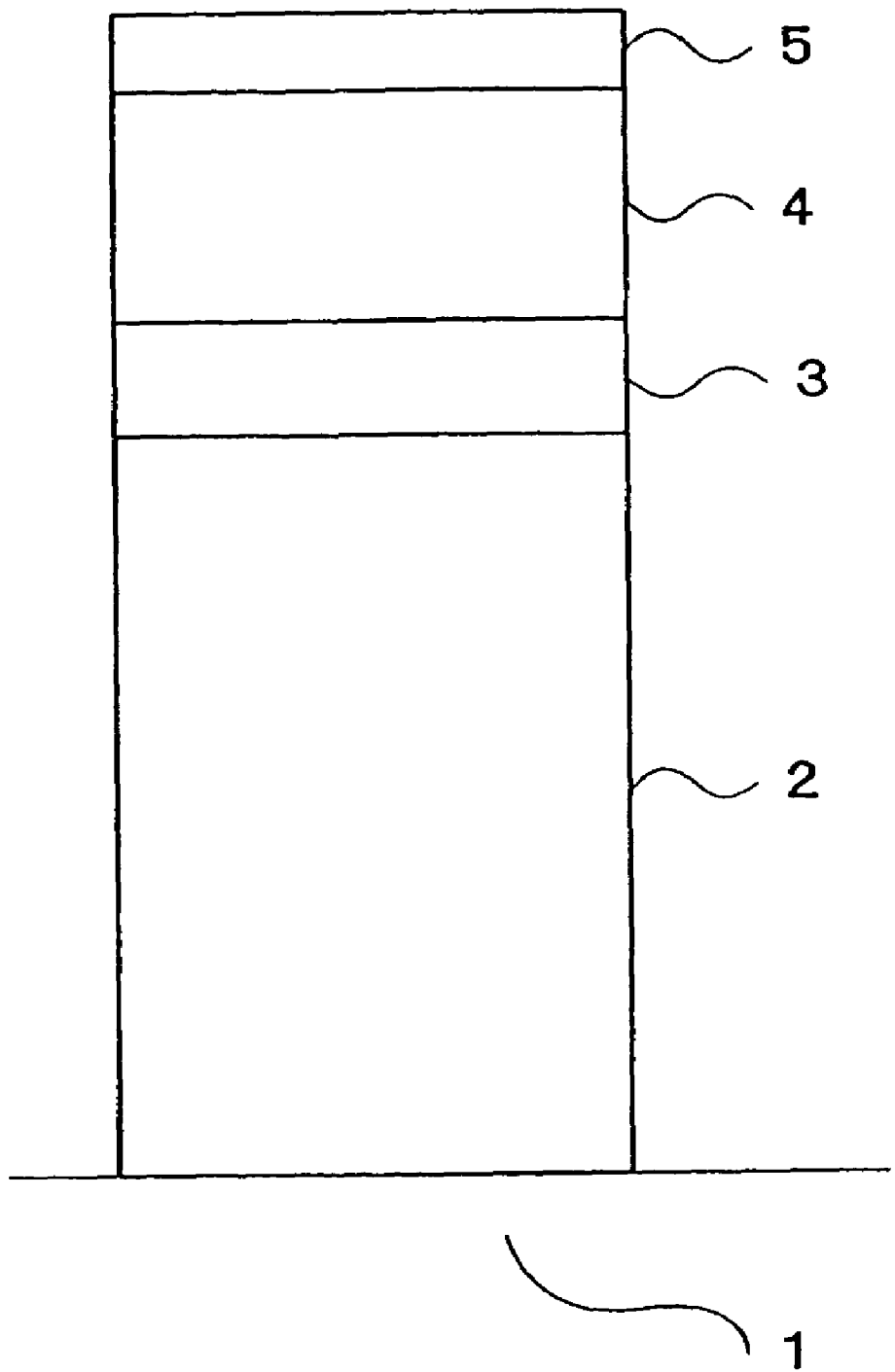
FIG. 1 is a diagram schematically illustrating the coating structure of the coated cutting tool of the present invention.
Figure 2:
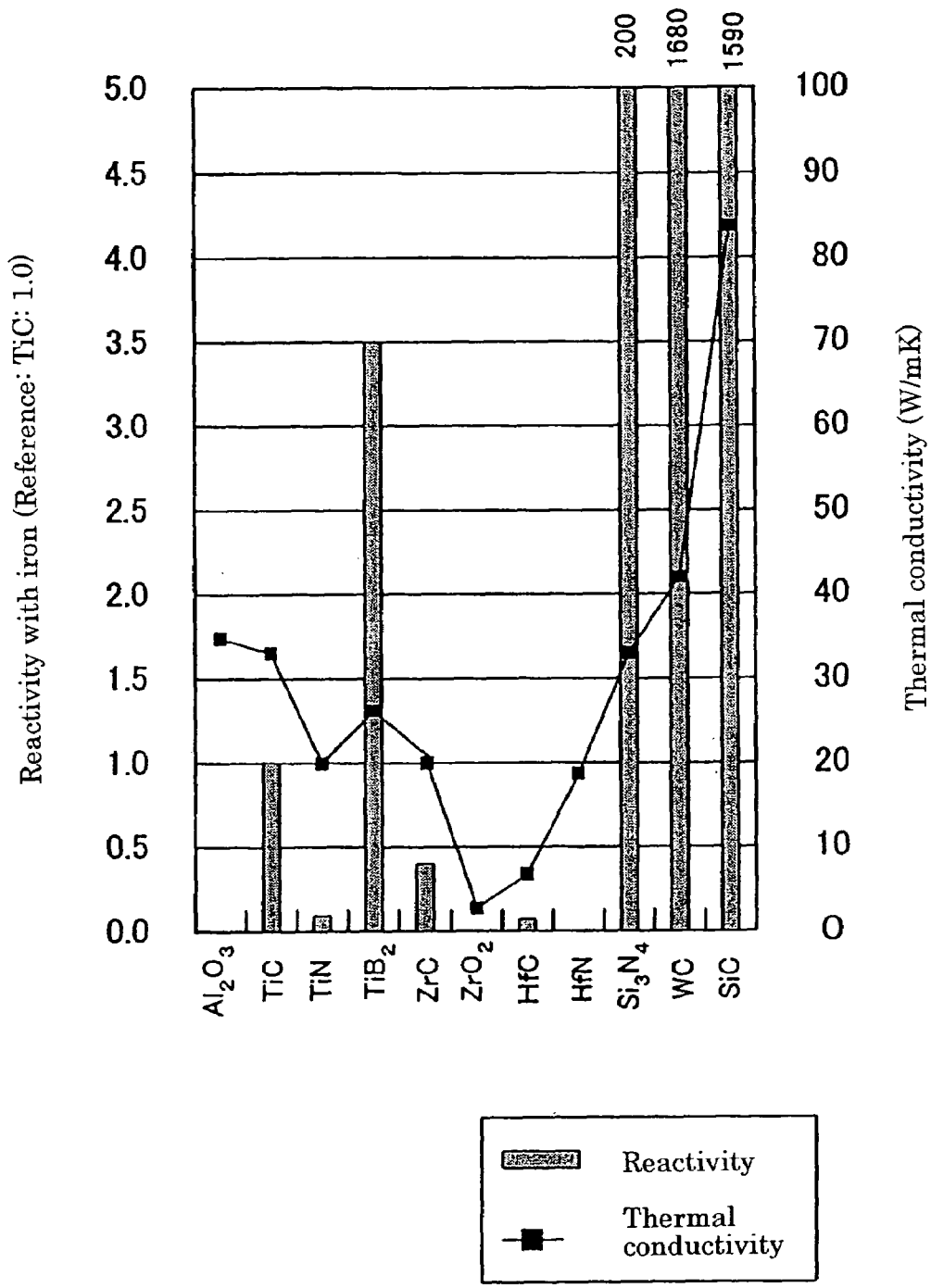
FIG. 2 is a graph showing the reactivity with iron and thermal conductivity of various ceramics.

Embodiments of the present invention are explained below.

(Test Example 1)

The material powders of a substrate A shown below were wet-mixed with a ball mill for 15 hours. The mixed powders were dried and formed with a press into a green compact. The green compact of this example had the shape of an indexable insert having chip breakers in accordance with ISO CNMG120408. The green compact was placed in a sintering furnace to sinter it at a temperature of 1,526.85° C. (1,800 K) under a vacuum of 100 Pa for 30 minutes. Only the vicinity of the cutting edge of the sintered body was subjected to a honing treatment with an SiC brush.

(Material Powders for the Substrate: wt. %)

A: TaC: 2.3, NbC: 1.2, TiC: 2, TiN: 2, ZrC: 0.2, Co: 6, WC: the remainder

B: TaC: 2.3, NbC: 1.2, TiC: 2, TiN: 2, TiCN: 0.2, Co: 6, Ni: 3, WC: the remainder C: TaC: 2.3, NbC: 1.2, TiC: 2, TiN: 2, ZrC: 0.2, Fe: 6, WC: the remainder On the surface of the substrate A, various coatings shown in Table 1 were formed in a CVD furnace at the gas composition, pressure, and temperature shown in Table 1. Out of the coatings shown in Table 1, coatings having a composition of TiCN, TiBN, α-$Al_2O_3$, and TiN were used as the inner layer, intermediate layer, outer layer, and identification layer, respectively. The inner layer had a thickness of 10 μm, the intermediate layer of 1.0 μm, the outer layer of 7 μm, and the identification layer of 3 μm. The TiCN used as the inner layer had a columnar-crystal structure throughout its structure with an aspect ratio of 7.0. Samples were produced by using two types of TiBN as shown in Table 2; one type satisfied the formula $0.001 < x/(x+y) < 0.04$ for $TiB_xN_y$ (x, y: atomic %) and the other did not. The surface roughness of the outermost layer of the obtained coating was measured by a method that observed the cross section of the tool and expressed the roughness within a reference length of 5 μm. The measured results showed that the vicinity of the cutting edge had a surface roughness, Rmax, of 0.15 μm, and the other portion than the vicinity of the cutting edge, of 0.70 μm. The TiBN layer had a surface roughness of 50 to 150 nm expressed by the vertical distance between the peak and valley lines within a reference length of 1 μm.

TABLE 1

| Composition of coating | Composition of reaction gas (volume %) | Pressure (kPa) | Temperature (° C.) |
|---|---|---|---|
| TiBN*1 | $TiCl_4$: 2%, $BCl_3$: 0.005%–2%, $N_2$: 10%–20%, $H_2$: remainder | 4–10.7 | 800–930 |
| TiN | $TiCl_4$: 2%, $N_2$: 25%, $H_2$: remainder | 13.3 | 950 |
| TiCN granular | $TiCl_4$: 2%, $CH_4$: 4%, $N_2$: 20%, $H_2$: remainder | 20 | 950 |
| TiCN columnar | $TiCl_4$: 2%, $CH_3CN$: 0.6%, $N_2$: 20%, $H_2$: remainder | 6.7–80 | 800–950 |
| TiC granular | $TiCl_4$: 2%, $CH_4$: 5%, $H_2$: remainder | 13.3 | 1,050 |
| TiC columnar | $TiCl_4$: 6%, $CH_4$: 12%, $H_2$: remainder | 20 | 1,150 |
| HfC | $HfI_2$: 12%, $C_4H_{10}$: 2%, $H_2$: remainder | 13.3 | 1,100 |
| VCN | $VI_2$: 10%, $C_4H_{10}$: 2%, $N_2$: 3%, $H_2$: remainder | 6.7 | 950 |
| TiBN*2 | $TiCl_4$: 2%, $BCl_3$: 5%, $N_2$: 5%, $H_2$: remainder | 13.3 | 950 |
| TiCNO columnar | $TiCl_4$: 2%, $CO_2$: 3%, $N_2$: 5%, $CH_3CN$: 0.1%, $H_2$: remainder | 13.3 | 950 |
| α-$Al_2O_3$ | $AlCl_4$: 2%, $H_2S$: 0.3%, $CO_2$: 5%, $H_2$: remainder | 6.7 | 1,050 |
| κ-$Al_2O_3$ | $AlCl_4$: 2%, $CO_2$: 5%, CO: 0.5%, $H_2$: remainder | 6.7 | 1,050 |
| $ZrO_2$ | $ZrCl_4$: 2%, $CO_2$: 5%, $H_2$: remainder | 6.7 | 1,050 |
| $HfO_2$ | $HfCl_4$: 2%, $CO_2$: 10%, $H_2$: remainder | 6.7–13.3 | 1,100 |

*1 The coating satisfies the formula $0.001 < x/(x + y) < 0.04$ for $TiB_xN_y$ (x, y: atomic %).
*2 The coating does not satisfy the formula $0.001 < x/(x + y) < 0.04$ for $TiB_xN_y$ (x, y: atomic %).

TABLE 2

| Sample No. | Intermediate layer | x/(x + y) | Workable time (min) Intermittent cutting | Workable time (min) Continuous cutting |
|---|---|---|---|---|
| 1-1 | TiBN | 0.001 | 15 | 10 |
| 1-2 | TiBN | 0.003 | 24 | 14 |
| 1-3 | TiBN | 0.01 | 30 | 20 |
| 1-4 | TiBN | 0.02 | 26 | 17 |
| 1-5 | TiBN | 0.04 | 7 | 5 |
| 1-6 | TiBN | 0.10 | 3 | 2 |

The samples produced under the above-described conditions were subjected to an intermittent cutting test under the conditions shown in Table 3 below and a continues cutting test under the conditions shown in Table 4 below. These tests evaluated the workable time until the tool reached the end of its useful life. These test results are also shown in Table 2.

TABLE 3

| Workpiece | SCM435 round bar with grooves |
|---|---|
| Cutting speed V(m/mm) | V = 250 |
| Feed f(mm/rev) | f = 0.30 |
| Depth of cut d(mm) | d = 1.5 |
| Cutting method | Wet cutting |

TABLE 4

| Workpiece | SUS304 round bar |
|---|---|
| Cutting speed V(m/mm) | V = 150 |
| Feed f(mm/rev) | f = 0.20 |
| Depth of cut d(mm) | d = 1.5 |
| Cutting method | Wet cutting |

As can be seen from Table 2, the samples that satisfied the formula $0.001<x/(x+y)<0.04$ for $TiB_xN_y$ (x, y: atomic %) had a long workable time in both the intermittent and continues cutting works resulting from the suppression of the spalling of the coating.

(Test Example 2)

On the surface of the substrate A described in Test example 1, a coating was formed in a CVD furnace at the gas composition, pressure, and temperature shown in Table 1. Out of the coatings shown in Table 1, coatings having a composition of TiCN, TiBN, α-$Al_2O_3$, and TiN were used as the inner layer, intermediate layer, outer layer, and identification layer, respectively. In Test example 2, the intermediate layer had the following structure. In addition to the above-described TiBN, the intermediate layer further contained at least one element contained in the inner layer, the outer layer, or both, except Ti, B, and N. When the intermediate layer contained at least one element contained in the inner layer, the amount of the at least one element contained in the inner layer was decreased continuously or stepwise from the inner-layer side toward the thicknesswise center of the intermediate layer. This structure was achieved by decreasing the amount of the inner layer-forming gas continuously or stepwise from the inner-layer side toward the thicknesswise center of the intermediate layer while the intermediate layer-forming gas was supplied. When the intermediate layer contained at least one element contained in the outer layer, the amount of the at least one element contained in the outer layer was decreased continuously or stepwise from the outer-layer side toward the thicknesswise center of the intermediate layer. This structure was achieved by increasing the amount of the outer layer-forming gas continuously or stepwise from the vicinity of the thicknesswise center of the intermediate layer to the outer layer while the intermediate layer-forming gas was supplied. Various samples in accordance with the above description were produced.

In order to compare with the coatings obtained by the above-described method, Sample 1–3 shown in Table 2 for Test example 1 was used. The above-described coatings of Test example 2 were produced so as to have the same thickness, aspect ratio, x/(x+y), surface roughness of the outermost layer of the tool, and vertical distance between the peak and valley lines of the TiBN layer as those of Sample 1–3 by adjusting the temperature and pressure.

The samples obtained in Test example 2 and Sample 1–3 were subjected to an intermittent cutting test under the conditions shown in Table 3. The test evaluated the workable time until the tool reached the end of its useful life. The test results showed that whereas Sample 1–3 performed a 30-minute working, the samples of Test example 2 were capable of working for 40 minutes.

They were also subjected to a continuos cutting test under the conditions shown in Table 4. The test also evaluated the workable time until the tool reached the end of its useful life. The test results showed that whereas Sample 1–3 performed a 20-minute working, the samples of Test example 2 were capable of working for 30 minutes.

The foregoing test results proved that the coating having the following structure has a long workable time in both the intermittent and continues cutting works resulting from the further suppression of the spalling of the coating:

(a) The intermediate layer is composed of titanium boronitride, $TiB_xN_y$ (x, y: atomic %), that satisfies formula 1.

$$0.001 < x/(x+y) < 0.04 \qquad \text{formula 1.}$$

(b) The intermediate layer further contains at least one element contained in the inner layer, the outer layer, or both, except Ti, B, and N.

(c) When contained in the intermediate layer, the at least one element contained in the inner layer decreases its amount continuously or stepwise from the inner-layer side toward the thicknesswise center of the intermediate layer.

(d) When contained in the intermediate layer, the at least one element contained in the outer layer decreases its amount continuously or stepwise from the outer-layer side toward the thicknesswise center of the intermediate layer.

(Test Example 3)

On the surface of the substrates A to C described in Test example 1, various coatings having a structure shown in Table 5 were formed. The coatings were subjected to the same cutting tests as in Test example 1. The forming conditions for individual coatings having a specific composition were the same as those shown in Table 1 for Test example 1. Table 6 shows the x/(x+y), aspect ratio, surface roughness of the outermost layer, and test results of the individual samples. In Table 6, the column "surface roughness of intermediate layer" shows the surface roughness by the vertical distance between the peak and valley lines within a reference length of 1 μm.

TABLE 5

| | | Constitution and thickness (μm) of coating | | | |
|---|---|---|---|---|---|
| Sample No. | Substrate | Inner layer | Intermediate layer | Outer layer | Identification layer |
| 2-1 | A | TiCN (0.5) | TiBN (1.0) | $Al_2O_3$ (5.0) | TiN (5.0) |
| 2-2 | A | TiCN (1.0) | TiBN (0.05) | $Al_2O_3$ (10) | TiN (0.2) |
| 2-3 | A | TiCN (10) | TiBN (1.0) | $Al_2O_3$ (0.2) | TiN (3.0) |
| 2-4 | A | TiCN (20) | TiBN (1.5) | $Al_2O_3$ (3.0) | TiN (3.0) |
| 2-5 | A | TiCN (15) | TiBN (1.0) | $Al_2O_3$ (15) | TiN (5.0) |
| 2-6 | A | TiN (2.0)/TiCN (3.0) | TiBN (0.1) | $Al_2O_3$ (10) | TiN (3.0) |
| 2-7 | A | TiN (2.0)/TiCNO (3.0)/TiCN (3.0) | TiBN (0.5) | $Al_2O_3$ (5.0) | TiC (0.5)/TiN (2.0) |
| 2-8 | A | TiN (2.0)/TiCN (5.0)/TiCNO (3.0) | TiBN (1.0) | $Al_2O_3$ (8.0) | TiN (3.0) |
| 2-9 | A | TiCN (25) | TiBN (0.2) | $Al_2O_3$ (10) | VCN (0.5)/TiN (0.5) |
| 2-10 | A | TiCN (3.0) | TiBN (0.5) | $Al_2O_3$ (5.0) | TiN (1.0) |
| 2-11 | A | TiCN (15)/granular TiC (2.0) | TiBN (0.8) | $Al_2O_3$ (8.0) | TiN (2.0) |
| 2-12 | A | TiN (0.2)/TiCN (7.0) | TiBN (0.9) | $Al_2O_3$ (2.0) | TiC (0.5)/TiN (0.5)/TiC (0.5) |
| 2-13 | A | Granular TiCN (20) | TiBN (1.5) | $Al_2O_3$ (3.0) | TiN (3.0) |
| 2-14 | A | TiN (0.5)/TiCN (7.0) | TiBN (0.8) | $\kappa$-$Al_2O_3$ (3.0) | TiN (2.0) |
| 2-15 | A | TiCNO (10)/VCN (0.5) | TiBN (1.0) | $Al_2O_3$ (3.0) | TiN (1.0) |
| 2-16 | A | TiC (10) | TiBN (0.5) | $Al_2O_3$ (5.0) | TiN (2.0) |
| 2-17 | A | TiN (0.5)/TiCN (10) | TiBN (1.0) | $Al_2O_3$ (5.0) | TiN (2.0) |
| 2-18 | A | TiN (0.3)/TiCN (10)/TiC (2.0) | TiBN (0.8) | $Al_2O_3$ (5.0) | TiN (2.0) |
| 2-19 | A | TiCN (12) | TiBN (0.7) | $Al_2O_3$ (3.0) | — |
| 2-20 | B | TiCN (10)/HfC (2.0) | TiBN (1.0) | $Al_2O_3$ (5.0) | HfC (1.0)/TiN (1.0) |
| 2-21 | C | TiCN (10) | TiBN (1.0) | $Al_2O_3$ (5.0) | TiN (2.0) |

Numerals in parentheses denote the thickness in micrometer.
All the TiCN, TiCNO, and TiC have a columnar-crystal structure unless otherwise stated.
All the $Al_2O_3$ are $\alpha$-$Al_2O_3$ unless otherwise stated.

TABLE 6

| | | | | Surface roughness of outermost layer (μm) | | Workable time (min) | |
|---|---|---|---|---|---|---|---|
| Sample No. | Surface roughness of intermediate layer (nm) | $TiB_xN_y$ x/(x + y) | Aspect ratio | Vicinity of cutting edge | Other portion | Intermittent cutting | Continuous cutting |
| 2-1 | 50 | 0.002 | 2.0 | 0.1 | 1.0 | 16 | 4 |
| 2-2 | 83 | 0.005 | 3.2 | 0.2 | 0.5 | 9 | 8 |
| 2-3 | 226 | 0.02 | 7.2 | 0.1 | 0.2 | 11 | 12 |
| 2-4 | 152 | 0.01 | 10.5 | 0.1 | 1.5 | 8 | 13 |
| 2-5 | 353 | 0.03 | 8.3 | 0.1 | 0.8 | 12 | 15 |
| 2-6 | 240 | 0.02 | 6.2 | 0.2 | 0.6 | 22 | 20 |
| 2-7 | 181 | 0.01 | 7.5 | 0.1 | 0.5 | 26 | 21 |

TABLE 6-continued

| Sample No. | Surface roughness of intermediate layer (nm) | $TiB_xN_y$ $x/(x + y)$ | Aspect ratio | Surface roughness of outermost layer (μm) | | Workable time (min) | |
|---|---|---|---|---|---|---|---|
| | | | | Vicinity of cutting edge | Other portion | Intermittent cutting | Continuous cutting |
| 2-8 | 198 | 0.02 | 9.1 | 0.1 | 0.8 | 28 | 18 |
| 2-9 | 78 | 0.008 | 12.5 | 0.2 | 0.5 | 12 | 14 |
| 2-10 | 203 | 0.02 | 4.8 | 0.3 | 0.7 | 13 | 8 |
| 2-11 | 242 | 0.02 | 8.5 | 0.1 | 0.5 | 30 | 20 |
| 2-12 | 386 | 0.03 | 6.0 | 0.2 | 1.3 | 20 | 18 |
| 2-13 | 195 | 0.01 | — | 0.2 | 0.7 | 8 | 5 |
| 2-14 | 154 | 0.01 | 7.1 | 0.2 | 0.7 | 17 | 16 |
| 2-15 | 232 | 0.02 | 7.8 | 0.1 | 0.5 | 17 | 17 |
| 2-16 | 165 | 0.01 | 7.1 | 0.2 | 0.5 | 13 | 10 |
| 2-17 | 172 | 0.01 | 7.0 | 0.1 | 0.5 | 25 | 17 |
| 2-18 | 225 | 0.02 | 8.2 | 0.2 | 0.6 | 24 | 18 |
| 2-19 | 217 | 0.02 | 8.0 | 0.1 | 0.5 | 21 | 18 |
| 2-20 | 241 | 0.02 | 7.2 | 0.1 | 0.5 | 29 | 20 |
| 2-21 | 189 | 0.01 | 7.1 | 0.2 | 0.5 | 30 | 19 |

Table 6 shows the following results:
(1) It is desirable that the inner layer be made of TiCN having a columnar-crystal structure with an aspect ratio of at least 5.
(2) It is desirable that the intermediate layer have a thickness of 0.1 to 2.0 μM.
(3) It is desirable that the outer layer have a thickness of 0.5 to 10 μm and be made of α-$Al_2O_3$.
(4) It is desirable that the vicinity of the cutting edge have a surface roughness, Rmax, of at most 0.2 μm, and the other portion than the vicinity of the cutting edge, of 0.2 to 1.3 μm.

(Test Example 4)

The substrate A described in Test example 1 was used to form a sintered body having the shape in accordance with ISO CNMG120408. The sintered body was provided with a coating. The coating comprised an inner layer (TiCN), an intermediate layer (at least one of TiBN and TiBNO), an outer layer (α-$Al_2O_3$), and an identification layer (TiN). The inner layer had a thickness of 10 μm, the intermediate layer of 1.0 μm, the outer layer of 7 μm, and the identification layer of 3 μm. Various samples were produced by varying the composition of the intermediate layer. Some of the intermediate layers had a composition-graded structure in which the oxygen content increased from the inner-layer side toward the outer layer continuously. Table 7 shows the composition of the intermediate layer of the individual samples.

The layer made of $TiB_xN_yO_z$ satisfying $0.001<x/(x+y)<0.04$ and $0.0005<x/(x+y+z)<0.04$ and $0<z/(x+y+z)<0.5$ was formed under the following conditions:
Composition: $TiCl_4$: 2 vol. %, $BCl_3$: 0.005 to 2 vol. %, $N_2$: 5 to 15 vol. %, NO: 5 to 15 vol. %, and $H_2$: the remainder Pressure: 4 to 10.7 kPa
Temperature: 800 to 930° C.

The layer made of $TiB_xN_yO_z$ unsatisfying $0.001<x/(x+y)<0.04$ and $0.0005<x/(x+y+z)<0.04$ and $0<z/(x+y+z)<0.5$ was formed under the following conditions:
Composition: $TiCl_4$: 2 vol. %, $BCl_3$: 5 vol. %, $N_2$: 5 to 15 vol. %, NO: 1 to 10 vol. %, and $H_2$: the remainder
Pressure: 13.3 kPa
Temperature: 950 ° C.

The intermediate layer having a composition-graded structure was formed by varying the amount of oxygen gradually. More specifically, the layer formation was possible by varying the amount of nitrogen oxide (NO) gas, the pressure, and the temperature.

All the inner layers had a columnar-crystal structure with an aspect ratio of 7. The surface roughness of the outermost layer of the obtained coating was measured by a method that observed the cross section of the tool within a reference length of 5 μm. The measured results showed that the vicinity of the cutting edge had a surface roughness, Rmax, of 0.15 μm, and the other portion than the vicinity of the cutting edge, of 0.90 μm. The TiBNO layer had a surface roughness of 100 to 300 nm expressed by the vertical distance between the peak and valley lines within a reference length of 1 μm. The TiBN layer had a surface roughness of 50 to 150 nm expressed by the same method.

The samples were subjected to an intermittent cutting test under the conditions shown in Table 3 and a continuos cutting test under the conditions shown in Table 4. The tests evaluated the workable time until the tool reached the end of its useful life. The test results, also, are shown in Table 7.

TABLE 7

| | Intermediate layer | | | | | | | | Workable time (min) | |
|---|---|---|---|---|---|---|---|---|---|---|
| | Inner-layer side | | | | Outer-layer side | | | | | |
| Sample No. | Composition | x/(x + y) | x/(x + y + z) | z/(x + y + z) | Composition | x/(x + y) | x/(x + y + z) | z/(x + y + z) | Intermittent cutting | Continuous cutting |
| 3-1 | TiBNO | 0.001 | 0.0005 | 0.6 | TiBNO | 0.001 | 0.0005 | 0.6 | 12 | 37 |
| 3-2 | TiBNO | 0.0016 | 0.0008 | 0.45 | TiBNO | 0.0015 | 0.0008 | 0.45 | 32 | 47 |

TABLE 7-continued

| | Intermediate layer | | | | | | | Workable time (min) | |
|---|---|---|---|---|---|---|---|---|---|
| | Inner-layer side | | | | Outer-layer side | | | | |
| Sample No. | Composition | $x/(x+y)$ | $x/(x+y+z)$ | $z/(x+y+z)$ | Composition | $x/(x+y)$ | $x/(x+y+z)$ | $z/(x+y+z)$ | Intermittent cutting | Continuous cutting |
| 3-3 | TiBNO | 0.014 | 0.01 | 0.25 | TiBNO | 0.014 | 0.01 | 0.25 | 45 | 45 |
| 3-4 | TiBNO | 0.022 | 0.019 | 0.14 | TiBNO | 0.024 | 0.020 | 0.16 | 46 | 40 |
| 3-5 | TiBNO | 0.039 | 0.037 | 0.05 | TiBNO | 0.039 | 0.037 | 0.05 | 49 | 36 |
| 3-6 | TiBNO | 0.04 | 0.04 | 0.001 | TiBNO | 0.04 | 0.04 | 0.001 | 29 | 18 |
| 3-7 | TiBNO | 0.05 | 0.05 | 0.0001 | TiBNO | 0.05 | 0.05 | 0.0001 | 11 | 10 |
| 3-8 | TiBN | 0.01 | — | 0 | TiBN | 0.01 | — | 0 | 30 | 20 |
| 3-9 | TiBN | 0.01 | — | 0 | TiBNO | 0.014 | 0.01 | 0.25 | 55 | 45 |
| 3-10 | TiBNO | 0.014 | 0.01 | 0.25 | TiBN | 0.01 | — | 0 | 31 | 25 |

As can be seen from Table 7, the samples having an intermediate layer made of TiBNO satisfying $0.001<x/(x+y)<0.04$ and $0.0005<x/(x+y+z)<0.04$ and $0<z/(x+y+z)<0.5$ had a notably long tool life. In particular, Sample 3–9, whose intermediate layer was composed of TiBN, which does not contain oxygen, placed at the inner-layer side and TiBNO, which contains oxygen, placed at the outer-layer side, had a significantly long tool life.

INDUSTRIAL APPLICABILITY

As explained above, the coated cutting tool of the present invention can have an increased bonding strength between the inner layer and the outer layer. This improvement is achieved by using a bonding layer composed of at least one of titanium boronitride and titanium oxyboronitride for bonding the inner layer and the outer layer and by specifying the content of boron and oxygen. The use of the titanium boronitride containing a specified amount of boron can minimize the reaction with the workpiece even when the outer layer is spalled, so that the adhesion of the workpiece can be prevented. In particular, when the intermediate layer is composed of titanium boronitride, which does not contain oxygen, placed at the inner-layer side and titanium oxyboronitride, which contains oxygen, placed at the outer-layer side, the tool life can be further increased.

The invention claimed is:

1. A coated cutting tool comprising a substrate and a coating on the substrate, the coating comprising an inner layer, an intermediate layer, and an outer layer, each comprising at least one layer;
the inner layer:
 (a) being composed of at least one material selected from the group consisting of the carbide, nitride, carbonitride, boride, boronitride, borocarbonitride, oxide, oxycarbide, oxynitride, and oxycarbonitride of the elements belonging to the IVa, Va, and VIa groups in the periodic table; and
 (b) including at least one layer having a columnar-crystal structure; the outer layer being composed of at least one oxide selected from the group consisting of aluminum oxide, zirconium oxide, hafnium oxide, and their solid solutions;
the intermediate layer:
 (c) being composed of titanium boronitride, $TiB_xN_y$ (x, y: atomic %), that satisfies $$0.001<x/(x+y)<0.04 \qquad \text{formula 1;}$$

(d) having an average thickness of 0.1 to 1 μm; and (e) having a surface roughness of 50 to 500 nm expressed by the vertical distance between the peak line and the valley line within a reference length of 1 μm.

2. A coated cutting tool as defined by claim 1, wherein the titanium boronitride, $TiB_xN_y$ (x, y: atomic %), in the intermediate layer satisfies $$0.003<x/(x+y)<0.02 \qquad \text{formula 2.}$$

3. A coated cutting tool as defined by claim 1, wherein the intermediate layer is composed of titanium oxyboronitride, $TiB_xN_yO_z$ (x, y, z: atomic %), that satisfies $$0.001<x/(x+y)<0.04 \qquad \text{formula 1}$$

and $$0.0005<x/(x+y+z)<0.04 \text{ and } 0<z/(x+y+z)<0.5 \qquad \text{formula 3.}$$

4. A coated cutting tool as defined by claim 1, wherein the intermediate layer:
 (a) comprises:
  (a1) titanium boronitride, $TiB_xN_y$ (x, y: atomic %), at the inner-layer side, the titanium boronitride satisfying $$0.001<x/(x+y)<0.04 \qquad \text{formula 1; and}$$

(a2) titanium oxyboronitride, $TiB_xN_yO_z$ (x, y, z: atomic %), at the outer-layer side, the titanium oxyboronitride satisfying $$0.001<x/(x+y)<0.04 \qquad \text{formula 1 and}$$

$$0.0005<x/(x+y+z)<0.04 \text{ and } 0<z/(x+y+z)<0.5 \qquad \text{formula 3; and}$$

(b) has a structure in which the amount of the oxygen content increases from the inner-layer side toward the outer-layer side.

5. A coated cutting tool comprising a substrate and a coating on the substrate, the coating comprising an inner layer, an intermediate layer, and an outer layer, each comprising at least one layer;
the inner layer:
 (a) being composed of at least one material selected from the group consisting of the carbide, nitride, carbonitride, boride, boronitride, borocarbonitride, oxide, oxycarbide, oxynitride, and oxycarbonitride of the elements belonging to the IVa, Va, and VIa groups in the periodic table; and
 (b) including at least one layer having a columnar-crystal structure; the outer layer being composed of at least one oxide selected from the group consisting of aluminum oxide, zirconium oxide, hafnium oxide, and their solid solutions;

the intermediate layer:
(c) containing:
(c1) titanium boronitride, $TiB_xN_y$ (x, y: atomic %), that satisfies $$0.001 < x/(x+y) < 0.04 \quad \text{formula 1; and}$$

(c2) at least one element contained in at least one of the inner layer and the outer layer, except Ti, B, and N;
(d) having an element distribution in that:
(d1) when contained in the intermediate layer, the at least one element contained in the inner layer decreases its amount continuously or stepwise from the inner-layer side toward the thicknesswise center of the intermediate layer; and
(d2) when contained in the intermediate layer, the at least one element contained in the outer layer decreases its amount continuously or stepwise from the outer-layer side toward the thicknesswise center of the intermediate layer;
(e) having an average thickness of 0.1 to 1 μm; and
(f) having a surface roughness of 50 to 500 nm expressed by the vertical distance between the peak line and the valley line within a reference length of 1 μm.

6. A coated cutting tool as defined by claim 5, wherein the titanium boronitride, $TiB_xN_y$ (x, y: atomic %), in the intermediate layer satisfies $$0.003 < x/(x+y) < 0.02 \quad \text{formula 2.}$$

7. A coated cutting tool as defined by claim 5, wherein the intermediate layer is composed of titanium oxyboronitride, $TiB_xN_yO_z$ (x, y, z: atomic %), that satisfies $$0.001 < x/(x+y) < 0.04 \quad \text{formula 1}$$

and $$0.0005 < x/(x+y+z) < 0.04 \text{ and } 0 < z/(x+y+z) < 0.5 \quad \text{formula 3.}$$

8. A coated cutting tool as defined by claim 5, wherein the intermediate layer:
(a) comprises:
(a1) titanium boronitride, $TiB_xN_y$ (x, y: atomic %), at the inner-layer side, the titanium boronitride satisfying $$0.001 < x/(x+y) < 0.04 \quad \text{formula 1; and}$$

(a2) titanium oxyboronitride, $TiB_xN_yO_z$ (x, y, z: atomic %), at the outer-layer side, the titanium oxyboronitride satisfying $$0.001 < x/(x+y) < 0.04 \quad \text{formula 1 and}$$

$$0.0005 < x/(x+y+z) < 0.04 \text{ and } 0 < z/(x+y+z) < 0.5 \quad \text{formula 3; and}$$

(b) has a structure in which the amount of the oxygen content increases from the inner-layer side toward the outer-layer side.

9. A coated cutting tool as defined by any one of claims 1 to 8, wherein the inner layer has an average thickness of 1.0 to 20.0 μm and the outer layer has an average thickness of 0.5 to 10.0 μm.

10. A coated cutting tool as defined by any one of claims 1 to 8, wherein the or each layer of the at least one layer having a columnar-crystal structure and being included in the inner layer:
(a) is composed of one of titanium carbonitride and titanium oxycarbonitride;
(b) has an average thickness of 1.0 to 20.0 μm; and
(c) has an aspect ratio of at least 5 in the columnar-crystal structure.

11. A coated cutting tool as defined by any one of claims 1 to 8, wherein the outer layer is composed mainly of α-type $Al_2O_3$.

12. A coated cutting tool as defined by any one of claims 1 to 8, wherein the coating further comprises at the outside of the outer layer an identification layer that:
(a) is composed of at least one material selected from the group consisting of the carbide, nitride, carbonitride, oxide, oxycarbide, oxynitride, and oxycarbonitride of the elements belonging to the IVa, Va, and VIa groups in the periodic table; and
(b) has an average thickness of 0.2 to 5.0 μm.

13. A coated cutting tool as defined by any one of claims 1 to 8, wherein the outermost layer of the coating has an average surface roughness, Rmax, of 0.2 to 1.3 μm within a reference length of 5 μm at the portion for making contact with a workpiece except the vicinity of the cutting edge when measured by a method that observes the cross section of the tool.

14. A coated cutting tool as defined by any one of claims 1 to 8, wherein the outermost layer of the coating has a surface roughness, Rmax, of at most 0.2 μm within a reference length of 5 μm in the vicinity of the cutting edge when measured by a method that observes the cross section of the tool.

15. A coated cutting tool as defined by any one of claims 1 to 8, wherein the substrate is made of cemented carbide composed of:
(a) a hard phase that:
(a1) consists mainly of tungsten carbide; and
(a2) contains at least one material selected from the group consisting of the carbide, nitride, carbonitride, and their solid solutions of the metals belonging to the IVa, Va, and VIa groups in the periodic table, excluding tungsten carbide; and
(b) a binder phase that contains at least one element selected from the iron-group metals.

* * * * *